US010249610B1

United States Patent
Appaswamy et al.

(10) Patent No.: US 10,249,610 B1
(45) Date of Patent: Apr. 2, 2019

(54) IGBT COUPLED TO A REVERSE BIAS DEVICE IN SERIES

(71) Applicant: TEXAS INSTRUMENTS INCORPORATED, Dallas, TX (US)

(72) Inventors: Aravind Chennimalai Appaswamy, Plano, TX (US); James P. Di Sarro, Allen, TX (US); Krishna Praveen Mysore Rajagopal, Santa Clara, CA (US); Akram A. Salman, Plano, TX (US); Muhammad Yusuf Ali, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/897,020

(22) Filed: Feb. 14, 2018

(51) Int. Cl.
| | | |
|---|---|---|
| *H01L 27/00* | (2006.01) | |
| *H01L 29/00* | (2006.01) | |
| *H04L 21/00* | (2006.01) | |
| *H01L 27/02* | (2006.01) | |
| *H01L 29/10* | (2006.01) | |
| *H01L 29/08* | (2006.01) | |
| *H01L 29/739* | (2006.01) | |

(52) U.S. Cl.
CPC ...... *H01L 27/0262* (2013.01); *H01L 27/0255* (2013.01); *H01L 29/083* (2013.01); *H01L 29/1095* (2013.01); *H01L 29/7393* (2013.01)

(58) Field of Classification Search
CPC . H01L 27/0262; H01L 27/0255; H01L 27/15; H01L 27/0259; H01L 27/0623; H01L 29/083; H01L 29/1095; H01L 29/7393; H01L 21/743; H01L 21/84; H01L 21/187; H01L 21/0251
See application file for complete search history.

(56) References Cited

U.S. PATENT DOCUMENTS

| | | | |
|---|---|---|---|
| 5,721,656 A * | 2/1998 | Wu | H01L 27/0251 257/355 |
| 6,194,764 B1 * | 2/2001 | Gossner | H01L 27/0248 257/355 |
| 7,995,046 B2 * | 8/2011 | Kobayashi | G09G 3/296 345/204 |
| 2008/0068369 A1 * | 3/2008 | Kobayashi | G09G 3/296 345/212 |

* cited by examiner

*Primary Examiner* — Nikolay K Yushin
(74) *Attorney, Agent, or Firm* — Rose Alyssa Keagy; Charles A. Brill; Frank D. Cimino

(57) ABSTRACT

In some examples, an electrostatic discharge (ESD) device comprises an insulated-gate bipolar transistor (IGBT) comprising a source terminal, an anode terminal, a gate terminal, and a body terminal; and at least one reverse bias device comprising a first terminal and a second terminal, wherein the first terminal couples to the source terminal and the second terminal couples to the body terminal.

20 Claims, 13 Drawing Sheets

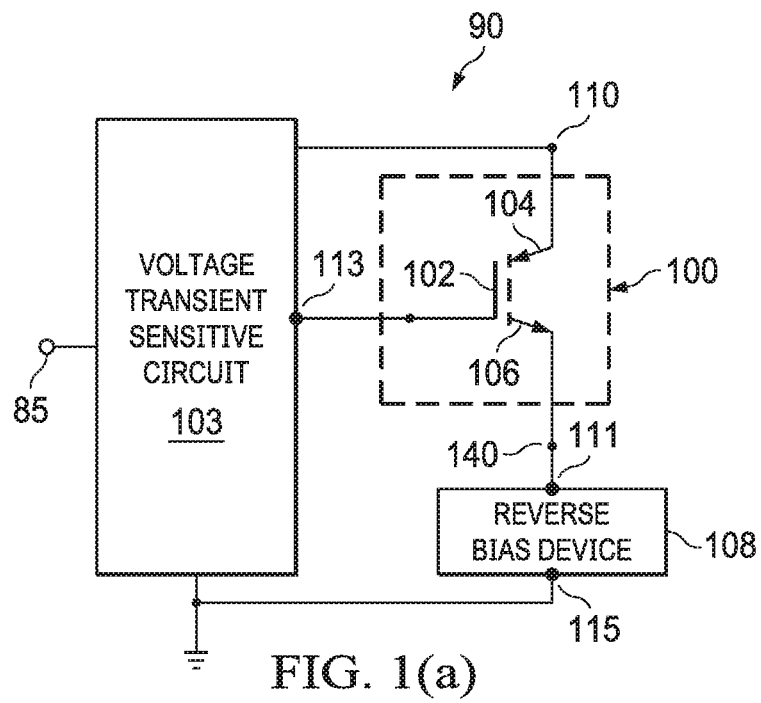
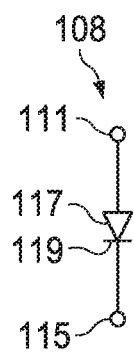 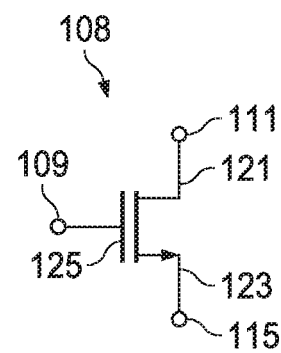
FIG. 1(a)
FIG. 1(c)  FIG. 1(d)

IGBT COUPLED TO A REVERSE BIAS DEVICE IN SERIES

BACKGROUND

Modern day electronics extensively use sub-micron scale semiconductor integrated circuits (ICs). An IC includes an input/output (I/O) interface that enables it to interact with other electronic circuits (or ICs). The I/O interface, in some cases, exposes the IC to unwarranted charge inputs, which can cause a sudden flow of high current in the IC. In some cases, a protection circuit is coupled to the I/O interface to prevent the high current to damage the IC.

SUMMARY

In accordance with at least one example, an electrostatic discharge (ESD) device comprises an insulated-gate bipolar transistor (IGBT) comprising a source terminal, an anode terminal, a gate terminal, and a body terminal; and at least one reverse bias device comprising a first terminal and a second terminal, wherein the first terminal couples to the source terminal and the second terminal couples to the body terminal.

In accordance with another example, an electrostatic discharge (ESD) device comprises a diode comprising a cathode terminal and a first anode terminal; and an insulated-gate bipolar transistor (IGBT) comprising a source terminal, a second anode terminal, a gate terminal, and a body terminal, wherein the source terminal is coupled to the first anode terminal and the body terminal is coupled to the cathode terminal, wherein the IGBT further comprising: a first parasitic bipolar junction transistor (BJT) having a first emitter, a first base, and a first collector, wherein the first emitter couples to a second anode terminal; a second parasitic BJT having a second emitter, a second base, and a second collector, wherein the second emitter couples to the source terminal; and a metal oxide semiconductor field effect transistor (MOSFET) having a source, a drain, a gate, and a body; wherein the first emitter is coupled to the second collector, the first base, the drain, and the second anode terminal, wherein the first collector is coupled to the body, the second base, and the cathode electrode, wherein the second emitter is coupled to the, the source, and the source terminal.

In accordance with yet another example, a method comprises fabricating an insulated gate bipolar transistor (IGBT), wherein the IGBT comprises a body terminal, a source terminal, and a anode terminal; and coupling the IGBT with a reverse bias device comprising a first terminal and a second terminal, wherein the first terminal couples to the source terminal and the second terminal couples to the body terminal.

BRIEF DESCRIPTION OF THE DRAWINGS

For a detailed description of various examples, reference will now be made to the accompanying drawings in which:

FIG. 1(a) depicts an illustrative ESD protection circuit, in accordance with various examples.

FIGS. 1(c)-1(d) depict illustrative reverse biased devices, in accordance with various examples.

DETAILED DESCRIPTION

Figure 1B:
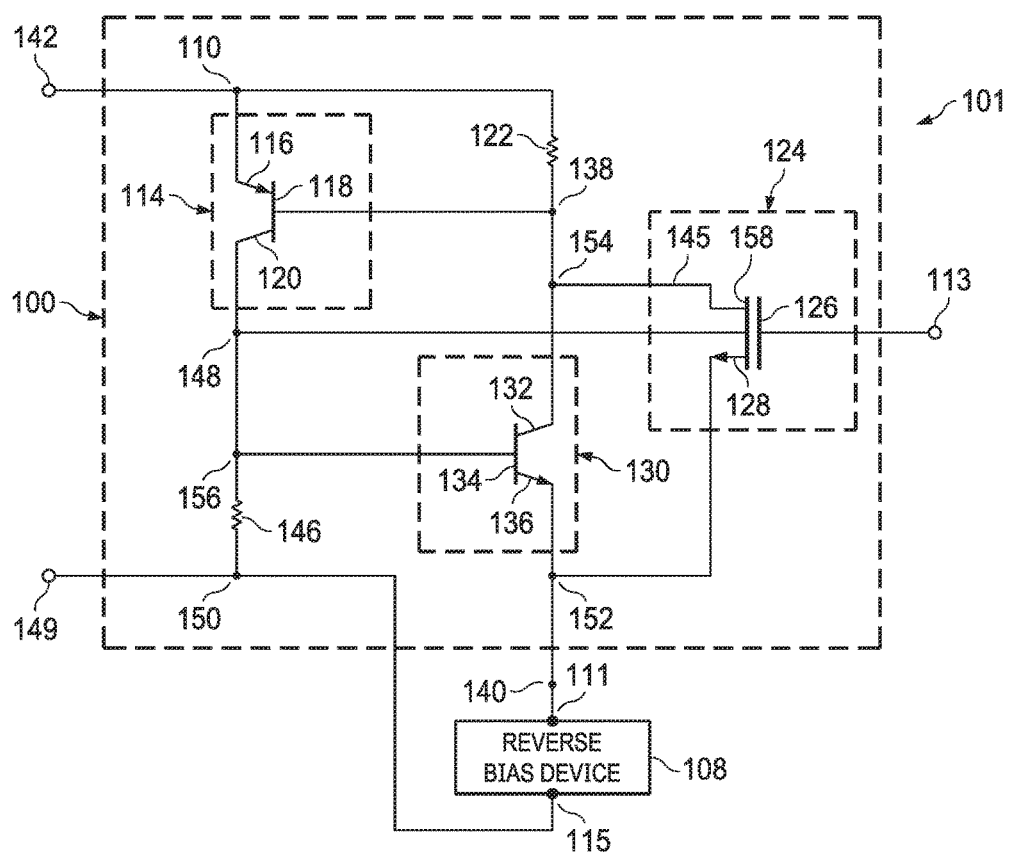
FIG. 1(b) depicts an illustrative equivalent circuit diagram of an IGBT, in accordance with various examples.

An electrostatic discharge (ESD) event is a sudden flow of high current between two electrically charged objects due to the presence of a potential difference between the two objects. For example, a user (e.g., a human) may cause an ESD event in an electronic device by coming into electrical contact with the electronic device. This event is typically modeled by the human body model (HBM). In some cases, a charged device model (CDM) may be employed to characterize the susceptibility of an electronic device to get damaged from an ESD event. Engineers employ a range of techniques to strengthen the protection system of an IC against an ESD event. One such technique involves using an electronic element (such as a diode) at the I/O interface. When an ESD event occurs, the diode junction breaks down in sub-nanosecond response time and shunts the ESD current away from the IC, thus protecting the IC from the ESD event.

ESD protection circuits are typically configured to switch off during normal signal operation and switch on during an ESD event. An ESD protection circuit (or ESD clamp circuit) can be built to respond to static overvoltage conditions. In such cases, the clamp circuit may redirect the current generated due to static overvoltage conditions to the ground and protect the coupled device. In other cases, an ESD clamp circuit may respond to transient voltage/current events. In such cases, a fast changing voltage or current at a node turns on the ESD clamp circuit.

In some cases, a diode, a metal-oxide-semiconductor-field-effect-transistor (MOSFET), or a silicon controlled rectifier (SCR) based clamps may be used in an ESD clamp circuit. The ESD clamp circuits are located at high voltage (e.g., 65V) I/O ports or between power rails, to release electrostatic stress before the electrostatic stress damages interior or core electronic circuits in an IC. Typically, in high voltage applications, the ESD clamp circuit includes drain-extended metal-oxide-semiconductor-field-effect-transistors (DEMOS) or laterally diffused metal-oxide-semiconductors (LDMOS).

The use of the LDMOS/DEMOS may be undesirable because the maximum current that may flow through the drain of LDMOS/DEMOS is limited (i.e., the drain current may saturate) at high gate-to-source voltages. This may be because at high gate voltages (e.g., 5V), the current flowing through the drain of the LDMOS/DEMOS is limited by the carrier concentration of the drain extension region. In some cases, this limitation may be resolved by increasing the doping concentration of the drain extension region (because increasing the carrier concentration in the drain extension increases the drain current). However, increasing the doping concentration in the drain extension region decreases the breakdown voltage of the LDMOS/DEMOS, which may render them unsuitable for the target ESD application.

In some cases, an insulated gate bipolar transistor (IGBT) may replace the LDMOS/DEMOS for ESD applications. An IGBT is similar in structure to LDMOS/DEMOS and may overcome the problem of drain current saturation at high gate-to-source voltages by introducing an additional diffusion layer, which injects minority carriers in the drain extension region. These injected minority carriers increase the carrier concentration in the drain extension region, which further increases the drain current (due to the higher concentration of carriers in the drain extension region due to the minority carrier injection).

However, introducing an additional diffusion layer brings about additional challenges, such as the formation of a silicon controlled rectifier (SCR) that may be considered parasitic, i.e., undesirable. Assuming an n-type DEMOS/LDMOS, the parasitic SCR is formed due to the introduction of a parasitic PNP transistor that couples to the intrinsic parasitic NPN transistor. The parasitic SCR may form a low impedance path between the power supply rails (between which the ESD protection circuit is connected) at a voltage lower than the rated voltage of the power supply rails causing the parasitic structure to shunt (i.e., latch-up) even in cases where there is no ESD event, thereby degrading the safe operating area of the IGBT. Latching-up, due to the presence of this parasitic SCR, may disrupt the normal functioning of the circuit the ESD clamp circuit is coupled to. Therefore, a system and/or apparatus are desired that may improve the safe operating area of an IGBT by mitigating above mentioned effect of the parasitic SCR.

As noted above, an IGBT, due to its fabricated structure and design, may include one or more parasitic bipolar junction transistors (BJTs). The presence of one of the parasitic BJTs (formed due to the diffusion of the additional layer in an IGBT) may be attributed to the latch-up condition described above.

Accordingly, at least some of the examples disclosed herein are directed towards an ESD protection device that is configured to prevent the occurrence of the latch-up condition. In some examples, the latch-up condition is prevented by employing at least one reverse bias device (e.g., a diode) that is coupled in series with an IGBT. As noted above, the parasitic BJT present in the IGBT may form a low impedance path at voltages lower than the desired voltage. This low impedance path may form when the potential of the body is higher than that of the source (or emitter) of the parasitic BJT. To mitigate this undesirable scenario, the series connected reverse bias device may be connected such that it introduces a reverse bias (and a voltage drop) to the emitter/source junction of the parasitic BJT, which pulls the potential of the source (or emitter) and keeps it higher than the potential of the body. Therefore, introducing a reverse bias (or voltage drop) across the emitter (or source) and body of the parasitic BJT may significantly prevent the formation of this low impedance path, which may further improve the safe operating area (SOA) of the IGBT.

In some examples, one reverse bias device may be coupled to multiple IGBTs. In other examples, each IGBT may have a reverse bias device coupled to it. In some examples, the reverse bias device may be a diode. The scope of the reverse bias device is not limited to a diode. In other examples, a gate controlled semiconductor device (e.g., a MOSFET) that is configured to generate a voltage drop across the emitter/source junction of the parasitic BJT may be used as the reverse bias device.

FIG. 1(a) depicts an illustrative ESD protection circuit 90 that includes a voltage transient sensitive circuit 103 coupled to an IGBT 100 and to a node 85 that couples to the IC (or a high voltage pin of the IC) being protected. The IGBT 100 may be coupled to a reverse bias device 108 at the node 140. The node 140 may further coupled to the node 111, which may act as the input of the reverse bias device 108. The reverse bias device 108 may include a node 115 that is coupled to a ground potential. The IGBT 100 includes a gate 102 coupled to a node 113 that is configured to provide a gate drive signal to the gate 102. The IGBT 100 includes an anode terminal 104 coupled to a node 110 that is configured to provide an anode signal (e.g., ESD current as the input signal) to the anode terminal 104. Further, the IGBT 100 includes an emitter terminal 106 that is configured to output an emitter signal (e.g., output signal). This emitter signal may be received by the reverse bias device 108. The emitter terminal 106, as described further below, may be referred to as source terminal 106.

Refer briefly to FIG. 1(c), and assume that the reverse bias device 108 is a diode. In such an example, the anode 117 of the diode 108 is coupled to the emitter terminal 106 via the node 111 and the cathode 119 of the diode 108 is coupled, in some examples, to the ground via the node 115. Now referring briefly to FIG. 1(d), in some examples, the reverse bias device 108 may be a MOSFET, as depicted in FIG. 1(d). In such an example, the drain terminal 121 may couple to the node 111 and the source terminal 123 may couple to the node 115. The gate 125 of the MOSFET may couple to a node 109, which may be driven by a gate driver (not expressly shown). Based on the signal provided by this gate driver, the voltage drop across the MOSFET may be controlled, which may further facilitate suppressing the parasitic SCR that leads to the latch-up condition.

During operation, an ESD event may cause a high voltage transient to occur at the node 85, which may result in a flow of high current (e.g., 1.5A) in a few micro/nano seconds. The voltage transient sensitive circuit 103 may be configured to sense such an event and, in response to the ESD event, generate a gate signal at the node 113 that may turn on the IGBT 100. In some examples, because of the presence of the reverse bias device 108, the gate signal may need to be higher than the gate signal needed to turn on the IGBT 100 had the reverse bias device 108 was not coupled to the IGBT 100. Stated another way, the presence of the reverse bias device 108 forces the IGBT 100 to require an additional voltage drop to turn on. The additional voltage needed to turn on the switch 100 may be substantially equal to the voltage drop across the reverse bias device 108. The presence of the reverse bias device 108 also produces a reverse bias at the emitter terminal 106 and the node 156 (FIG. 1(b)) that prevents the formation of the low impedance path inside the IGBT 100.

The IGBT 100 disclosed herein is an n-channel IGBT and the principles described in this disclosure may be valid of a p-channel IGBT.

Refer now to FIG. 1(b), which depicts an illustrative equivalent circuit diagram 101 of the IGBT 100. The IGBT 100 is coupled to the reverse bias device 108 at the node 140. The equivalent circuit diagram 101 includes a p-n-p BJT 114, an n-p-n BJT 130, and a MOSFET 124. For the sake of simplicity, the p-n-p BJT 114 and the n-p-n BJT are referred to as the BJT 114 and the BJT 130, respectively. The BJT 114 includes an emitter 116, a collector 120 and a base 118. The emitter 116 of the BJT 114 forms the anode terminal 104 of the IGBT 100 (FIG. 1(a)) and couples to the node 110. The BJT 130 includes a collector 132, a base 134, and an emitter 136. The emitter 136 forms the emitter terminal 106 of the IGBT 100. In some examples, the BJT 130 may be termed as a parasitic BJT and the emitter 136 couples to the reverse bias device 108 at the node 140. The emitter 136 couples (or the source 128 of the MOSFET 124) to the node 111 of the reverse bias device 108 and the node 115 of the reverse bias device 108, which may further be coupled to ground potential (not expressly shown) through the node 144. The collector 132 couples to the node 110 through the resistor 122.

In some examples, the resistor 122 may be a representation of the resistance experienced by the carriers in the IGBT 100, and may not be physically coupled between the emitter 116 and the drain 145. A similar principle may apply for the resistor 146. The collector 132 couples to the base 118 at the node 138. The collector 120 couples to the base 134 at the node 156. The MOSFET 124 includes a source 128 that couples to the emitter 136 at the node 152, a gate 126 that couples to the node 113 that receives the gate drive signal of the IGBT 100. Therefore, in some examples, the terminal 106 (FIG. 1(a)) can either be referred to as emitter terminal 106 or source terminal 106

The MOSFET 124 also includes a drain 145 that couples to the base 118 of the BJT 114 at the node 154. The body 158 of the MOSFET 124 is coupled to the collector 120 at the node 148. As noted above, the presence of the reverse bias device 108 forces the IGBT 100 to require an additional voltage drop to turn on. The additional voltage may be substantially equal to the voltage drop across the reverse bias device 108. The presence of the reverse bias device 108 also produces a reverse bias at the emitter 136 and the base 134 of the BJT 130 and the body 158 of the MOSFET 124, which prevents the formation of the low impedance path due to the second BJT 130.

Figure 2A:
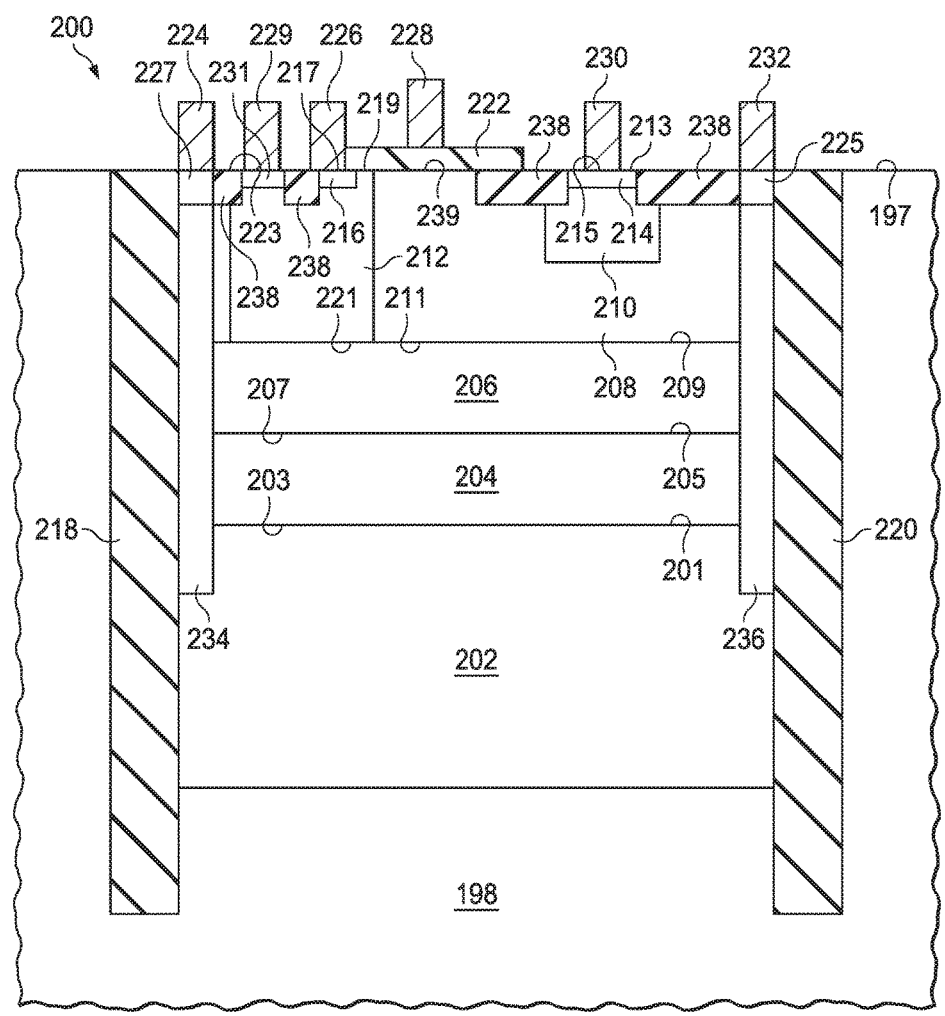
FIG. 2(a) depicts a side-view cross section of an illustrative IGBT, in accordance with various examples.

Now refer to FIG. 2(a). FIG. 2(a) depicts a side-view cross section of an illustrative IGBT 200. The IGBT 200 includes a substrate 198 that may be formed using silicon. The substrate 198 may be doped with p-type dopants (e.g., group III elements of the periodic table). The IGBT 200 also includes n-type buried layer 202 having a top side 201. The n-type buried layer 202 may be formed by implanting n-type dopants (e.g., group V elements of the periodic table) in the substrate 198. The IGBT 200 includes a p-type epitaxial layer 204 formed by implanting p-type dopants in the substrate 198. The p-type epitaxial layer 204 includes a top side 205 and a bottom side 203, where the bottom side 203 interfaces with the top side 201. The IGBT 200 further includes a p-type buried layer 206 including a top side 209 and a bottom side 207, where the bottom side 207 interfaces with the top side 205. The p-type buried layer 206 is formed by implanting p-type dopants in the substrate 198. The IGBT 200 also includes an n-type well 208 that is formed by implanting n-type dopants in the substrate 198. The n-type well 208 includes a top side 239 and a bottom side 211, where the bottom side 211 interfaces with the top side 209 and the top side 239 interfaces with the top side 197 of the substrate 198. The IGBT 200 includes a p-type well 212 formed by implanting p-type dopants in the n-type well 208 and includes a top side 219 and a bottom side 221. In some examples, the bottom side 221 interfaces with the top side 209 and the top side 219 interfaces with the top side 197.

The IGBT 200 further includes an n-type well 216 that is formed by doping n-type dopants in the p-type well 212. The n-type well 216 includes a top side 217 that interfaces with the top side 197. The IGBT 200 also includes a p-type well 231 that is formed by doping additional p-type dopants in the p-type well 212. The p-type well 231 includes a top side 223 that interfaces with the top side 197. The IGBT 200 includes an n-type well 210 that is formed by implanting n-type dopants in the n-type well 208. The n-type well 210 includes a top side 215 that interfaces the top side 197. The IGBT 200 also includes a p-type well 214 that is formed by implanting p-type dopants in the n-type well 208. The p-type well 214 includes a top side 213 interfacing with the top side 197. The IGBT 200 includes deep trench layers 218 and 220. The IGBT 200 also includes trenches 225, 227, 234, and 236 that are doped with n-type dopants and extend from the top side 197 into the n-type buried layer 202. In some examples, the IGBT 200 may include electrodes 224, 236, 228, 230, and 232. The IGBT 200 also includes a gate oxide layer 222 that couples to the electrode 228 (gate electrode). In some examples, the IGBT 200 may also include shallow trench isolation layers 238 that separate active regions in the n-type well 208. From a fabrication perspective, the BJT 114 may form between the p-type well 214, p-type well 212, n-type well 208, and n-type well 210. The emitter 116 (FIG. 1(b)) of the BJT 114 may be formed by the p-type well 214, the base 118 (FIG. 1(b)) may be formed in n-type well 208 and n-type well 210. The collector 120 may be formed in p-type well 212. The emitter 116 may couple to the electrode 230. The electrode 230 may also be referred to as anode 230 of the IGBT 200. The BJT 130 may form between the n-type well 216, p-type well 212, the n-type well 208, and n-type well 210. The emitter 136 (FIG. 1(b)) of the BJT 130 may be formed by the n-type well 216, the base 134 (FIG. 1(b)) may be formed in p-type well 212, the collector 132 may be formed in n-type well 208 and n-type well 210. The emitter 136 may couple to the electrode (or terminal) 226. The source terminal (or source) 226 may also be referred to as the source 226 of the IGBT 200. The MOSFET 124 may form between n-type well 216, with the electrode 228 acting as the gate electrode, and n-type well 208 and 210.

Figure 2B:
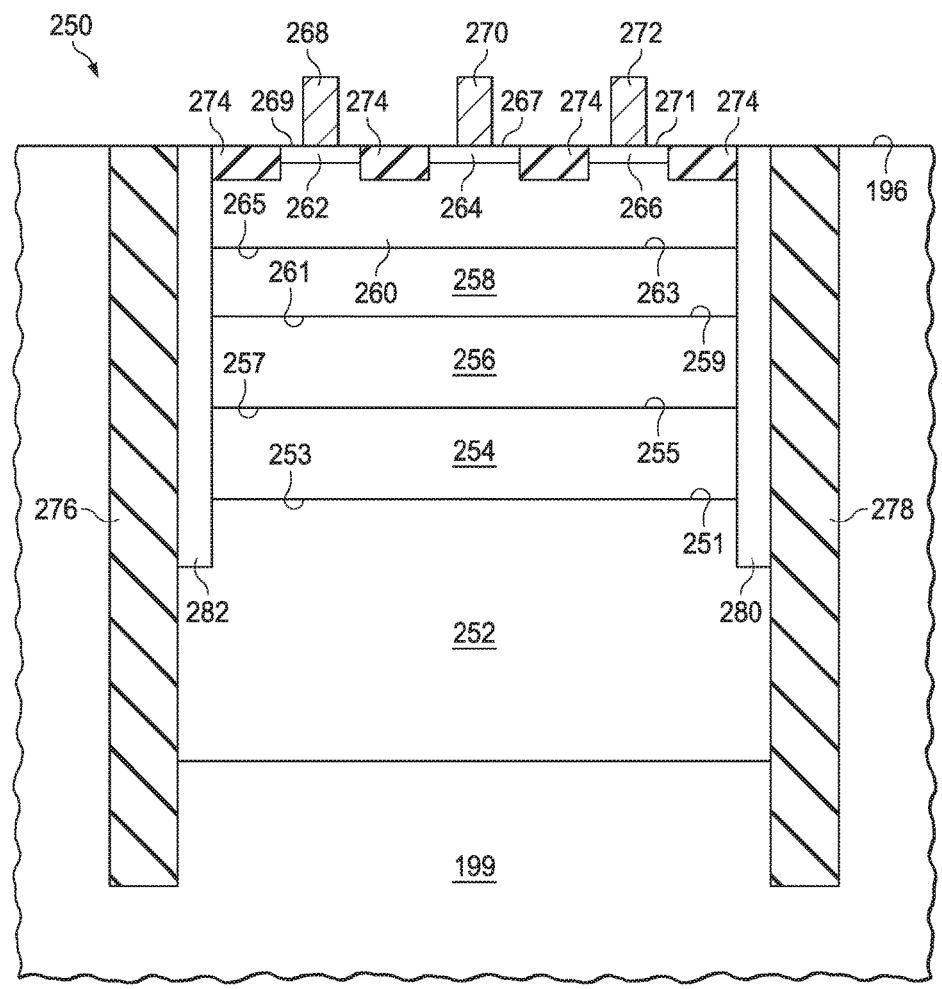
FIG. 2(b) depicts a side-view cross section of an illustrative diode, in accordance with various examples.

Now refer to FIG. 2(b). FIG. 2(b) depicts a side-view cross section of an illustrative diode 250 that is configured to couple in series with the IGBT 200. The diode 250 includes a substrate 199 that may be formed using silicon. The substrate 199 may be doped with p-type dopants. The diode 250 includes n-type buried layer 252 having a top side 251. The n-type buried layer 252 may be formed by implanting n-type dopants in the substrate 199. The diode 250 includes a p-type epitaxial layer 254 formed by implanting p-type dopants in the substrate 199. The p-type epitaxial layer 254 includes a top side 255 and a bottom side 253, where the bottom side 253 interfaces with the top side 251. The diode 250 further includes a p-type buried layer 256 including a top side 259 and a bottom side 257, where the bottom side 257 interfaces with the top side 255. The p-type buried layer 256 is formed by implanting p-type dopants in the substrate 199. The diode 250 also includes another p-type well 258 that is formed by implanting p-type dopants in the substrate 199. The p-type well 258 includes a top side 263 and a bottom side 261, where the bottom side 261 interfaces with the top side 259. The diode 250 includes an n-type well 260 formed by implanting n-type dopants in the substrate 199 and includes a top side 273 and a bottom side 265, where the bottom side 265 interfaces with the top side 263 and the top side 273 interfaces with the top side 196 of the substrate 199.

The diode 250 further includes an n-type well 262 that is formed by doping n-type dopants in the n-type well 260. The n-type well 262 includes a top side 269 that interfaces with the top side 196. The diode 250 includes an n-type well 271 that is formed by implanting n-type dopants in the n-type well 260. The n-type well 271 includes a top side 271 that interfaces the top side 196. The diode 250 also includes a p-type well 264 that is formed by implanting p-type dopants in the n-type well 260. The p-type well 264 includes a top side 267 interfacing with the top side 196. The diode 250 includes deep trench layers 276 and 278. The diode 250 also includes trenches 280, 282 that are doped with n-type dopants and extend from the top side 196 into the n-type buried layer 252. In some examples, the diode 250 may include electrodes 268, 270, 228, and 272. In some examples, the diode 250 may also include shallow trench isolation layers 274 that separate active regions in the n-type well 260. The electrodes 268 and 272 form the cathode terminal/electrode of the diode 250 and the electrode 270 forms the anode terminal/electrode of the diode 250. As noted above, the IGBT 200, in some examples, may couple to the diode 250 in series. In such a scenario, the source 226 may couple to the anode electrode 270. In some examples, the IGBT 200 and the diode 250 may be positioned in a same substrate. In other examples, the IGBT 200 and the diode 250 may be positioned in different substrates.

Figure 3A:
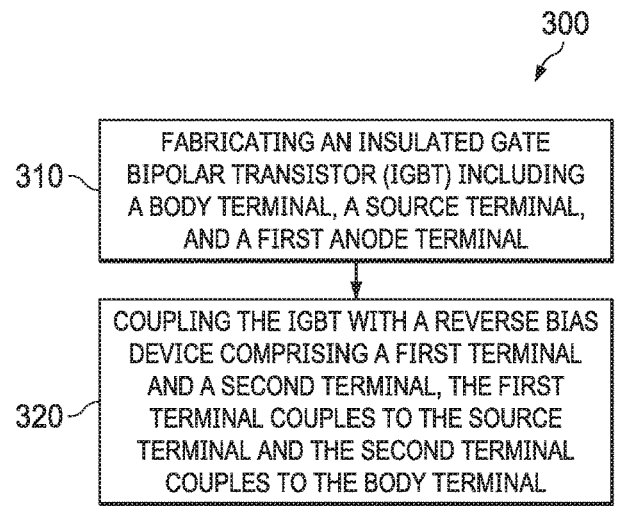
FIG. 3(a) depicts an illustrative method to couple a reverse bias device in series with an IGBT, in accordance with various examples.
Figure 3B:
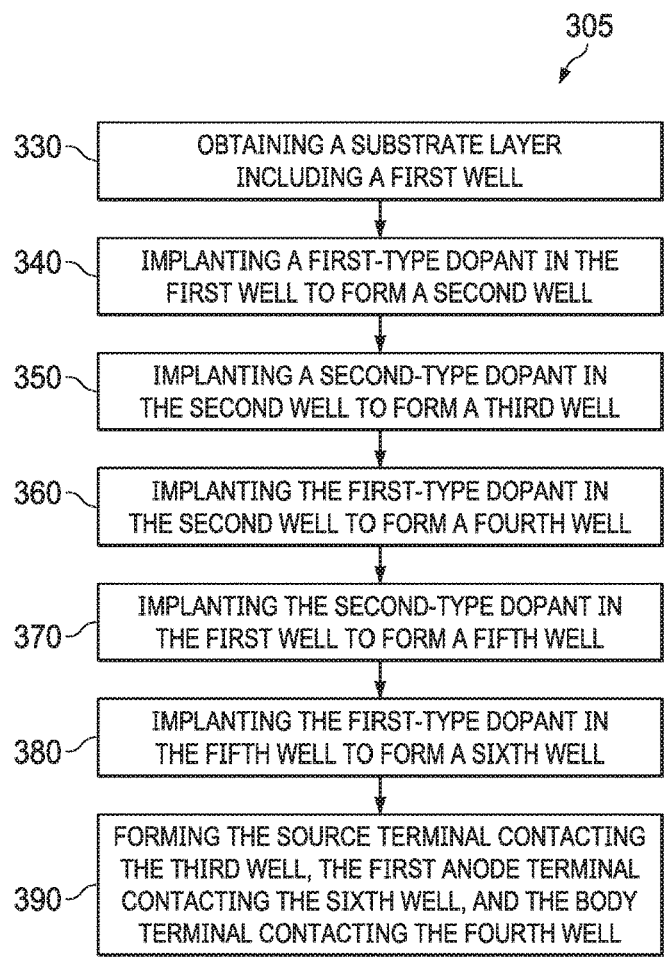
FIG. 3(b) depicts an illustrative method to fabricate an IGBT, in accordance with various examples.
Figure 4A:
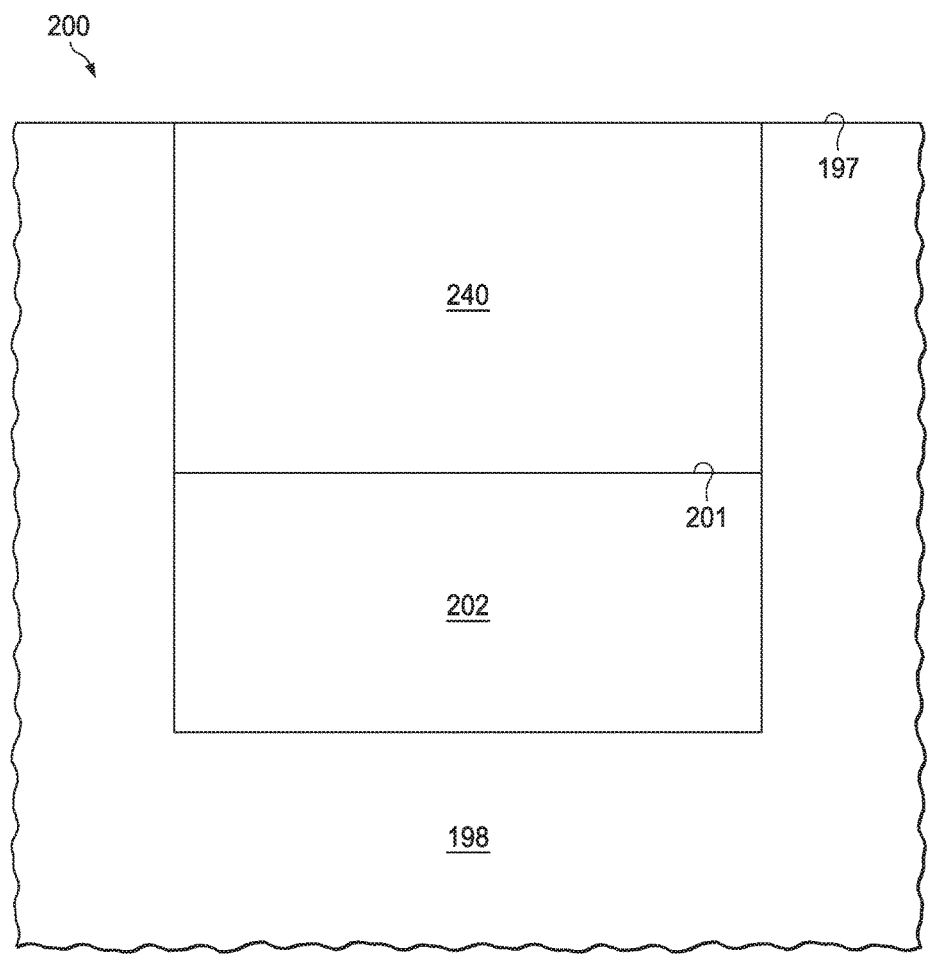
FIG. 4(a)-4(h) depicts an illustrative process flow diagram to fabricate an IGBT that is coupled to a diode in series, in accordance with various examples.
Figure 4B:
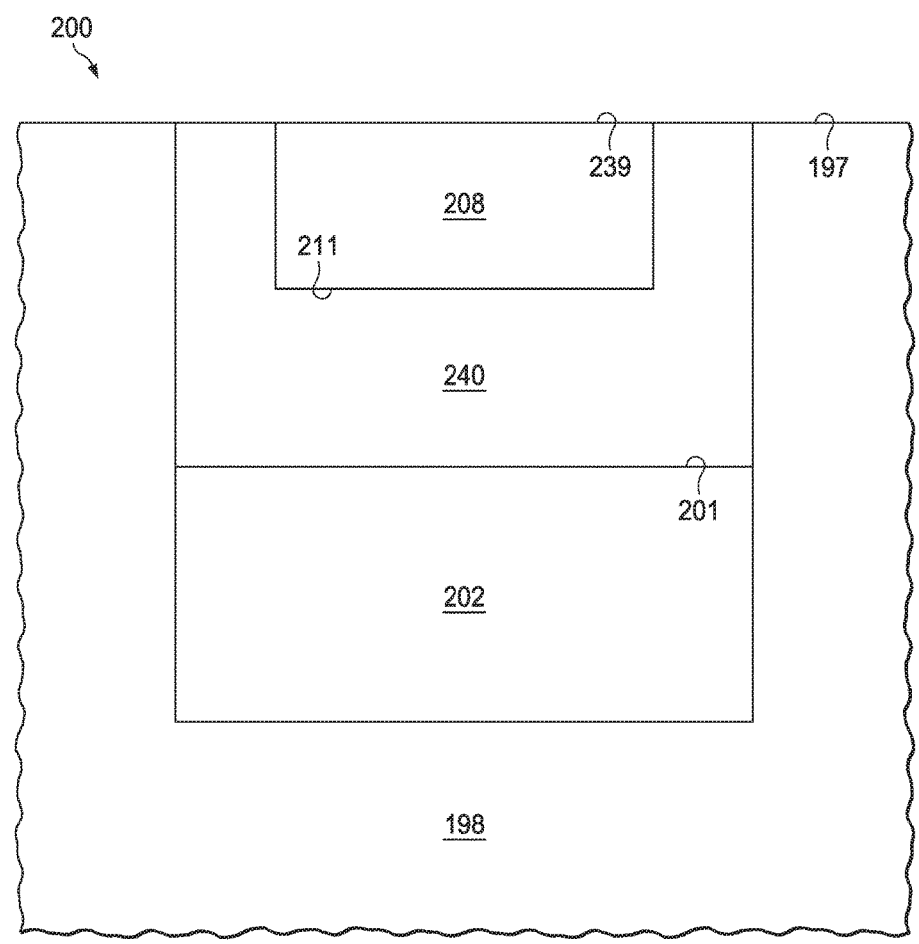
Figure 4C:
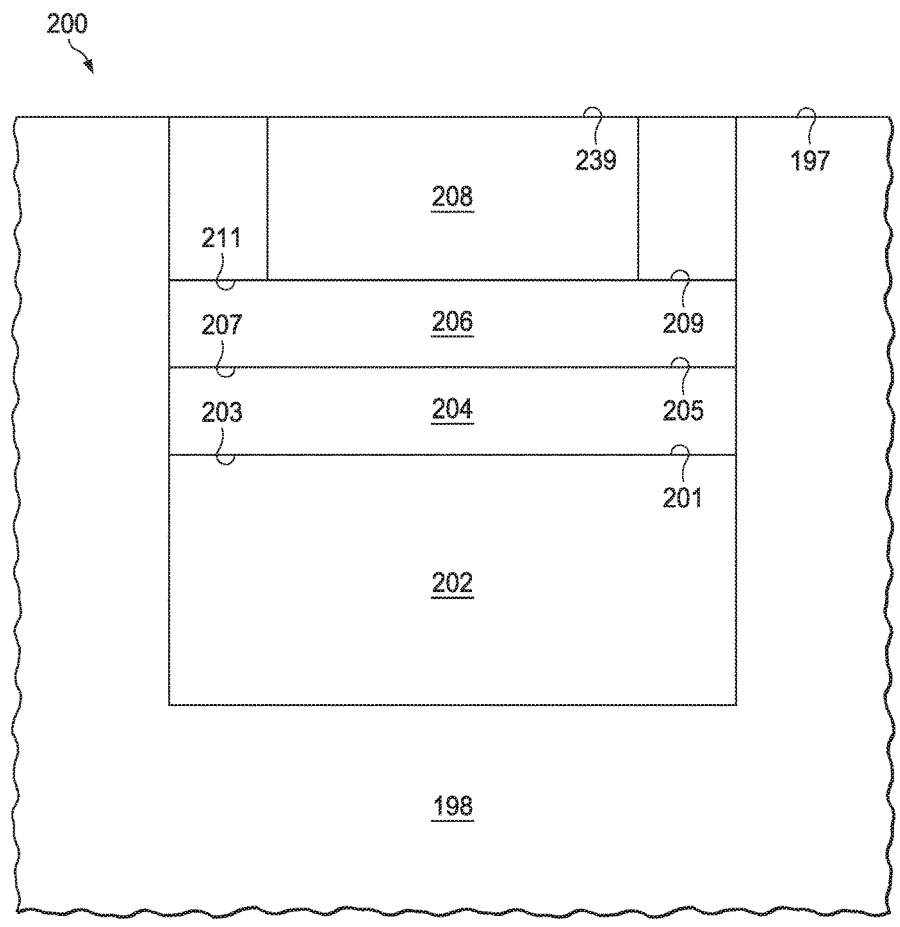

FIG. 3(a) depicts an illustrative method to couple a reverse bias device in series with an IGBT. The method 300 begins with fabricating an IGBT that includes a body terminal, a source terminal, and an anode terminal (step 310) and coupling the IGBT with a reverse bias device such that one of the terminals of the reverse bias device couples to the source terminal of the IGBT and the other terminal of the reverse bias device couples to the body terminal. Refer now to FIG. 3(b), which depicts a method 305 of the fabrication of such an IGBT. The method 305 is now described in tandem with FIG. 4(a)-4(h). The method 300 begins in step 330 with obtaining a substrate layer 198 including the n-type well 208 (FIG. 2(a)). Prior to obtaining the substrate 198 (doped at concentration of around $10^{15}$-$10^{16}$/cm$^3$) including the n-type well 208, the substrate 198 may go through some fabrication steps, such as implanting n-type dopants in the substrate 198 to form the n-type buried layer 202 (doped at concentration of around $10^{18}$-$10^{19}$/cm$^3$). The n-type buried layer 202 having a top side 201 (FIG. 4(a)). Following the formation of the buried layer 202, the substrate 198 may be implanted with p-type dopants to form an epitaxial layer 240 (doped at concentration of around $10^{15}$/cm$^3$) (FIG. 4(a)). Further, the n-type well 208 (doped at concentration of around $10^{16}$-$10^{17}$/cm$^3$) may be formed by implanting second-type dopants in the substrate 198 (FIG. 4(b)). The n-type well 208 includes a top side 239 and a bottom side 211, the top side 239 interfaces with the top side 197 of the substrate 198. In some examples, substrate 198 may further be implanted with p-type dopants to form the p-type buried layer 206 (doped at concentration of around $10^{16}$-$10^{17}$/cm$^3$) including a top side 209 and a bottom side 207, where the top side 209 interfaces with bottom side 211. The epitaxial layer 240, following the formation of the p-type buried layer 206, may be represented as a p-type epitaxial layer 204 with top side 205 and bottom side 203 (FIG. 4(c)).

Figure 4D:
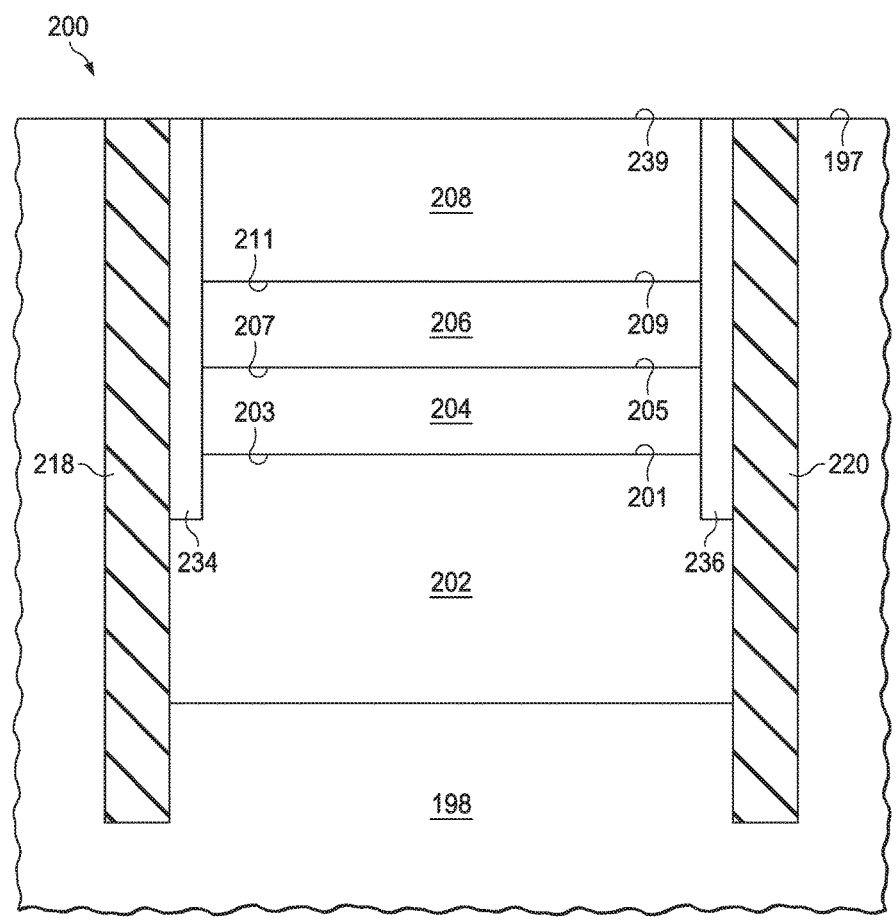
Figure 4E:
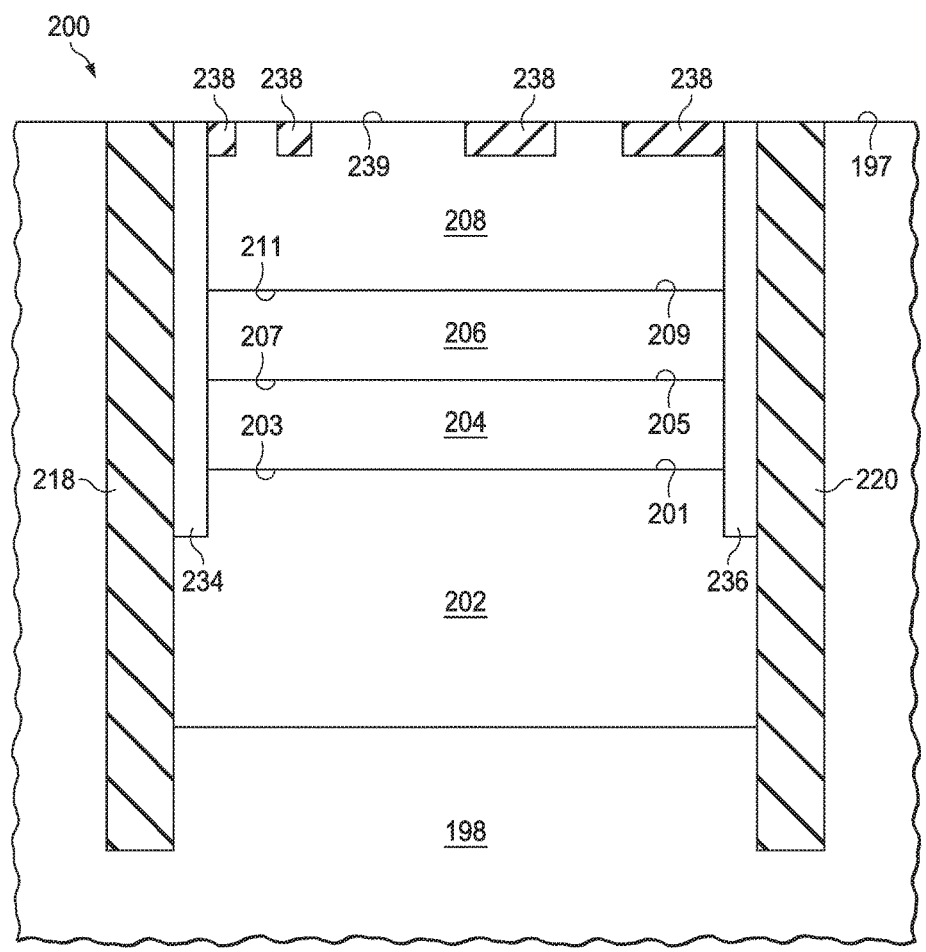
Figure 4F:
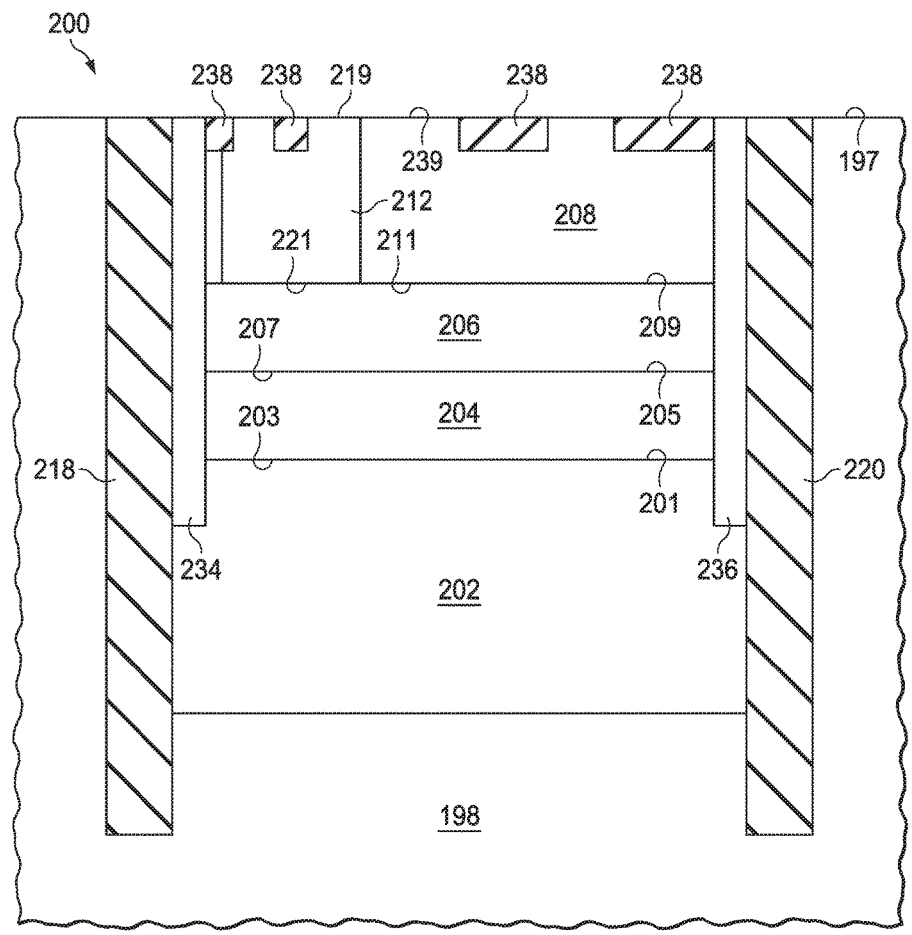
Figure 4G:
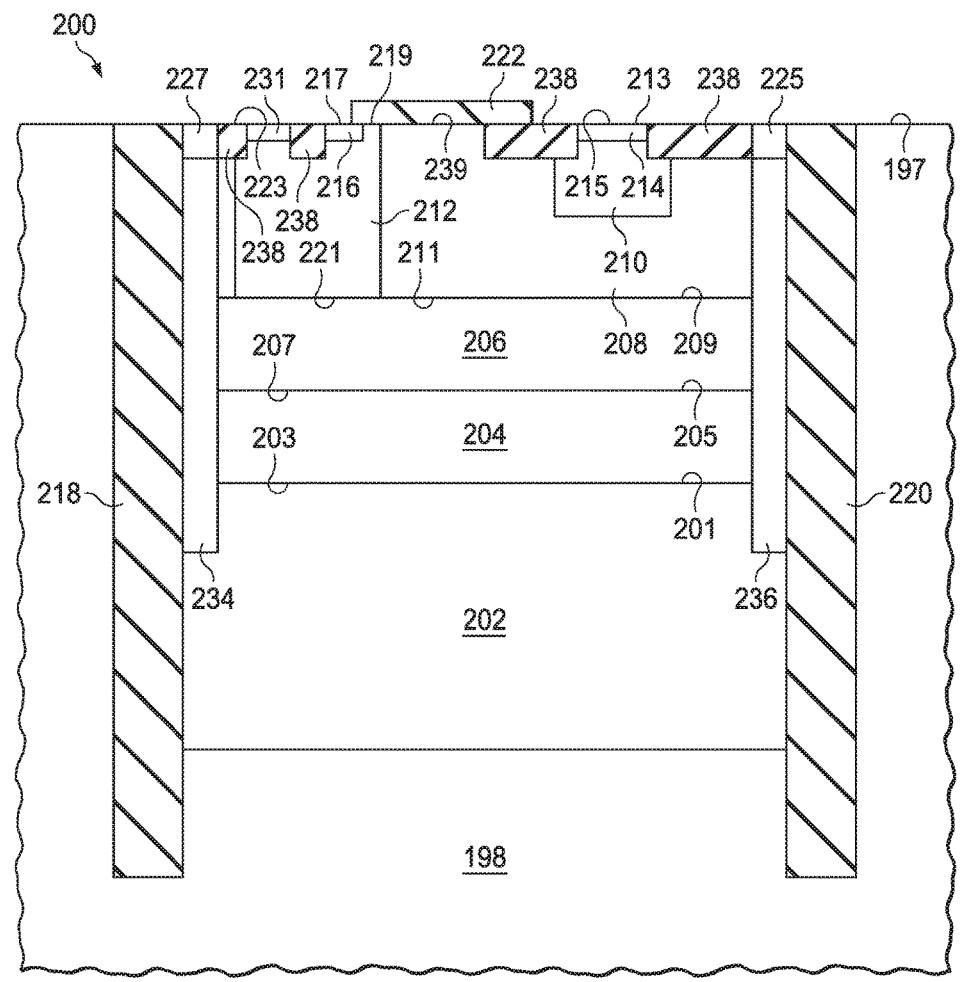
Figure 4H:
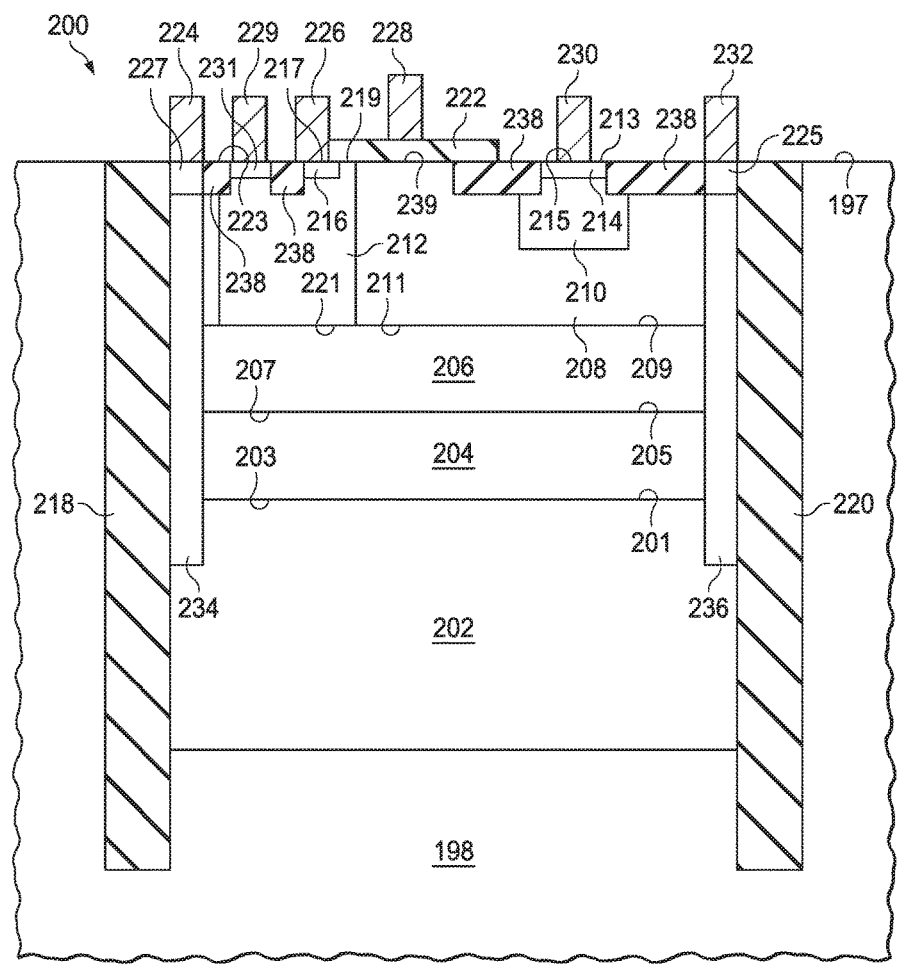

In some examples, following obtaining the substrate including the n-type buried layer 202, the p-type epitaxial layer 204, the p-type buried layer 206, and the n-type well 208, the method 305 may include etching a first deep trench 218 and a second deep trench 220 extending from the top side 197 into the substrate and depositing a dielectric layer in the first and the second deep trench (FIG. 4(d)). In some examples, the dielectric layer may be polysilicon. The method 305 may also include forming shallow trench isolation layers 238 (FIG. 4(e)) to isolate the active regions in the n-type well 208. The method 305 proceeds with step 340, which includes co-implanting an n-type and a p-type dopant in the n-type well 208 to form an p-type well 212 (doped at concentration of around $10^{18}$-$10^{19}$/cm$^3$) and a self-aligned n-type well (doped at concentration of around $10^{19}$-$10^{20}$/cm$^3$) (FIG. 4(f)). The p-type well 212 includes a top side 219 and a bottom side 221 such that the top side 219 interfaces with the top side 197 and the bottom side 221 interfaces with the top side 209 (or bottom side 211).

In some examples, the gate oxide layer 222 may be deposited on the top side 197 prior to proceeding with the step 350 (not limiting). The method 305 then proceeds with step 350 that includes implanting the n-type dopant in the n-type well 208 (or the p-type well 212) to form an n-type well 216 (doped at concentration of around $10^{19}$-$10^{20}$/cm$^3$) having a top side 217, the top side 217 interfacing the top side 197 (FIG. 4(g)). The method 305 then proceeds with step 360 that includes implanting the p-type dopant in the p-type well 212 to form a p-type well 231 having a top side 223, the top side 223 interfacing the top side 197 of the substrate 198 (FIG. 4(g)). The method 305 further proceeds to step 370, which includes implanting n-type dopant in the n-type well 208 to form the n-type well 210 (doped at concentration of around $10^{17}$-$10^{18}$/cm$^3$) having a top side 215 interfacing with the top side 197 (FIG. 4(g)). The method 305 further moves to step 380 that may include implanting p-type dopants in the n-type well 210 to form the p-type well 214 (doped at concentration of around $10^{19}$-$10^{20}$/cm$^3$) having top side 213 interfacing with the top side 197. The method 305 may further move to the step 390 that includes forming the source terminal 226, body terminal 229, gate terminal 228, and anode terminal 230. The gate electrode 228 couples to the gate oxide layer 222, the anode terminal 230 couples with the p-type well 214, the source terminal 226 couples the n-type well 216 (FIG. 4(h)).

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Additionally, the term "electrode" and "terminal" is used interchangeably. Thus, if a first device couples to a second device, that connection may be through a direct connection or through an indirect connection via other devices and connections.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. An electrostatic discharge (ESD) device comprising:
   an insulated-gate bipolar transistor (IGBT) comprising a source terminal, an anode terminal, a gate terminal, and a body terminal; and
   at least one reverse bias device comprising a first terminal and a second terminal, wherein the first terminal couples to the source terminal and the second terminal couples to the body terminal.

2. The ESD device of claim 1, wherein the anode terminal is to receive an electrostatic discharge (ESD) signal and the second terminal is to output the ESD signal.

3. The ESD device of claim 1, wherein the reverse bias device comprises a diode.

4. The ESD device of claim 3, further comprising an additional diode positioned in series with the diode.

5. The ESD device of claim 1, wherein the reverse bias device comprises a metal oxide semiconductor field effect transistor (MOSFET).

6. The ESD device of claim 5, further comprising an additional MOSFET positioned in series with the MOSFET.

7. The ESD device of claim 1, wherein the IGBT comprising:
a first parasitic bipolar junction transistor (BJT) having a first emitter, a first base, and a first collector;
a second parasitic BJT having a second emitter, a second base, and a second collector, wherein the first emitter couples to the second collector and the second emitter couples to the source terminal; and
a metal oxide semiconductor field effect transistor (MOSFET) having a second source that couples to the second emitter and the source terminal, a drain that couples to the first emitter and the second collector, a body that couples to the first collector and the body terminal, and a gate that couples to the gate terminal.

8. The ESD device of claim 1, wherein the IGBT is fabricated in a substrate doped with a first-type dopant, the IGBT comprises:
a first buried layer of a second-type dopant, the first buried layer having a first side;
an epitaxial layer doped with the first-type dopant and having a second side and
a third side, the second side interfacing with the first side;
a second buried layer doped with the first-type dopant and having a fourth side and a fifth side, the fourth side interfacing with the third side;
a first well region doped with the second-type dopant and having a sixth side and seventh side, wherein the sixth side interfaces with the fifth side and the seventh side interfaces with a top side of the substrate;
a second well region doped with the first-type dopant formed in the first well region;
a third well region doped with the second-type dopant and having an eighth side interfacing with the seventh side, wherein the third well region is formed in the second well region, wherein the source terminal contacts the third well region;
a fourth well region doped with the first-type dopant and having a ninth side interfacing with the seventh side, wherein the fourth well region is formed in the second well region, wherein the body terminal contacts the fourth well region;
a fifth well region doped with the second-type dopant formed in the first well region; and
a sixth well region doped with the first-type dopant and having a tenth side interfacing the seventh side, wherein the sixth well region is formed in the fifth well region.

9. The ESD device of claim 8, wherein the first-type dopant is a p-type dopant and the second-type dopant is an n-type dopant.

10. An electrostatic discharge (ESD) device comprising:
a diode comprising a cathode terminal and a first anode terminal; and
an insulated-gate bipolar transistor (IGBT) comprising a source terminal, a second anode terminal, a gate terminal, and a body terminal, wherein the source terminal is coupled to the first anode terminal and the body terminal is coupled to the cathode terminal, wherein the IGBT further comprising:
a first parasitic bipolar junction transistor (BJT) having a first emitter, a first base, and a first collector, wherein the first emitter couples to a second anode terminal;
a second parasitic BJT having a second emitter, a second base, and a second collector, wherein the second emitter couples to the source terminal; and
a metal oxide semiconductor field effect transistor (MOSFET) having a source, a drain, a gate, and a body;
wherein the first emitter is coupled to the second collector, the first base, the drain, and the second anode terminal, wherein the first collector is coupled to the body, the second base, and the cathode electrode,
wherein the second emitter is coupled to the, the source, and the source terminal.

11. The ESD device of claim 10, wherein the second anode terminal is to receive an ESD signal and the cathode terminal is to output the ESD signal.

12. The ESD device of claim 11, wherein the cathode electrode is coupled to a ground potential.

13. The ESD device of claim 10, wherein the first parasitic BJT is a p-n-p BJT and the second parasitic BJT is an n-p-n BJT.

14. The ESD device of claim 10, wherein the diode is configured to provide a reverse bias to the second base and the second emitter.

15. A method comprising:
fabricating an insulated gate bipolar transistor (IGBT), wherein the IGBT comprises a body terminal, a source terminal, and a anode terminal; and
coupling the IGBT with a reverse bias device comprising a first terminal and a second terminal, wherein the first terminal couples to the source terminal and the second terminal couples to the body terminal.

16. The method of claim 15, wherein fabricating the IGBT further comprising:
obtaining a substrate layer having a top side, the substrate layer having a first buried layer, a first epitaxial layer interfacing the first buried layer, a second buried layer interfacing the epitaxial layer, and a first well interfacing the second buried layer and the top side;
implanting a first-type dopant in the first well to form a second well;
implanting a second type-dopant in the second well to form a third well having a first side, the first side interfacing the top side;
implanting the first-type dopant in the second well to form a fourth well having a second side, the second side interfacing the top side;
implanting the second-type dopant in the first well to form a fifth well;
implanting the first-type dopant in the fifth well to form a sixth well having a third side, the third side interfacing the top side;
forming the source terminal contacting the third well, the anode terminal contacting the sixth well, and the body terminal contacting the fourth well.

17. The method of claim 16, wherein the first-type dopant is a p-type dopant and the second-type dopant is an n-type dopant.

18. The method of claim 15, wherein the reverse bias device comprises a diode.

19. The method of claim 15, wherein the reverse bias device comprises a metal oxide semiconductor field effect transistor (MOSFET).

20. The method of claim 15, wherein the anode terminal is to receive an electrostatic discharge (ESD) signal and the second terminal is to output the ESD signal.

* * * * *